United States Patent [19]
Furuichi et al.

[11] 4,271,371
[45] Jun. 2, 1981

[54] DRIVING SYSTEM FOR AN ULTRASONIC PIEZOELECTRIC TRANSDUCER

[75] Inventors: Shuhei Furuichi; Takahiko Nose, both of Minami, Japan

[73] Assignee: Kabushiki Kaisha Morita Seisakusho, Kyoto, Japan

[21] Appl. No.: 79,206

[22] Filed: Sep. 26, 1979

[51] Int. Cl.[3] .......... H01L 41/08
[52] U.S. Cl. .......... 310/316
[58] Field of Search .......... 310/314, 316, 317; 318/116, 118

[56] References Cited

U.S. PATENT DOCUMENTS

| | | | |
|---|---|---|---|
| 2,752,512 | 6/1956 | Sarratt | 310/316 X |
| 3,432,691 | 3/1969 | Shoh | 310/316 |
| 3,443,130 | 5/1969 | Shoh | 310/316 |
| 3,447,051 | 5/1969 | Atwood | 310/316 |
| 3,489,930 | 1/1970 | Shoh | 310/316 |
| 3,681,626 | 8/1972 | Puskas | 310/316 |
| 3,931,533 | 1/1976 | Raso | 310/316 |
| 3,975,650 | 9/1976 | Payre | 310/316 |

FOREIGN PATENT DOCUMENTS

| | | | |
|---|---|---|---|
| 555825 | 5/1977 | U.S.S.R. | 310/316 |

*Primary Examiner*—Mark O. Budd
*Attorney, Agent, or Firm*—Koda and Androlia

[57] ABSTRACT

A driving circuit for ultrasonic tools which uses a piezoelectric transducer to convert ultrasonic electric signals into ultrasonic mechanical vibrations including a voltage-controlled oscillator which produces an output signal at a frequency that is proportional to an input voltage, a power amplifier stage having its input coupled to the output of the voltage-controlled oscillator, the power amplifier stage including an output transformer which couples the output of the power amplifier stage to the piezoelectric transducer, the power output transformer further acting as both an insulating transformer and a boosting transformer for the driving circuit and a feedback transformer coupled in series with the secondary side of the output transformer and the piezoelectric transducer, the feedback transformer having a secondary side through which a current flows which is proportional to the current flowing through the piezoelectric transducer, a phase comparitor which detects the phase difference between two signals applied to two inputs of the phase comparitor, the two inputs being respectively coupled to the output signal of the voltage controlling oscillator and the secondary side of the feedback transformer and a low pass filter which blocks high frequency components to pass therethrough connected between an output of the phase comparitor and the input of the voltage controlled oscillator.

13 Claims, 5 Drawing Figures

DRIVING SYSTEM FOR AN ULTRASONIC PIEZOELECTRIC TRANSDUCER

BACKGROUND OF THE INVENTION

1. Field of Invention

This invention relates to ultrasonic piezoelectric transducer driving systems for use in ultrasonic tools which include a piezoelectric transducer to convert an ultrasonic electric signal into an electric mechanical vibration and especially to ultrasonic tools which require high-performance and safe and reliable operation.

2. Prior Art

When power is supplied to an ultrasonic piezoelectric transducer, the resonance frequency of the transducer varies according to the mechanical load on the transducer, variations and the temperature of the transducer, etc. As a result, the driving frequency deviates from the resonance frequency of the transducer to thereby lead to a drop in the electro-mechanical transducing efficiency of the transducer. This tendency is especially noticeable in high-Q piezoelectric transducers which have a high transducing efficiency. In these cases, a slight deviation of the driving frequency from the resonance frequency causes the electro-mechanical transducing efficiency to drop substantially to a point where practical use of the transducer becomes impossible. Accordingly, in cases where a high-Q piezoelectric transducer with a high electro-mechanical transducing is utilized, an automatic frequency tracking system which causes the driving frequency to vary along with the resonance frequency of the transducer is essential. While such frequency tracking systems exist in the prior art, such systems have certain disadvantages. In particular, such systems usually apply a high driving power to the transducer without providing electrical insulation between the transducer and the driving circuit. Accordingly, the danger of electrical shock is significant. In addition, such driving circuits also use conventional amplifier circuits to amplify the ultrasonic electrical signal and such amplifier circuits are not efficient.

Furthermore, in the prior art there are several types of ultrasonic transducer driving systems utilizing a phase lock loop. Such systems are described in the U.S. Pat. No. 3,931,533 issued to Frank A. Raso, U.S. Pat. No. 3,975,650 issued to Stephen C. Payre and U.S. Pat. No. 3,447,051 isued to John G. Atwood. However, the above described systems provide no protection against electrical shock hazards as is required in medical instruments and does not maintain a high level of performance. The appearance of the PZT type piezoelectric elements has caused a great improvement in the electro-mechanical transducing efficiency. In the case of such piezoelectric transducers (even the voltage driven type), however, an attempt to supply sufficient power results in a high service voltage. Accordingly, such transducers cannot be used in medical applications without taking sufficient protective measures against electrical shock.

SUMMARY OF THE INVENTION

Accordingly, it is the general object of the present invention to provide a driving system for an ultrasonic piezoelectric transducer which is very efficient in its energy utilization.

It is another object of the present invention to provide a driving system for an ultrasonic piezoelectric transducer which provides electrical insulation between the driving system and the piezoelectric transducer.

It is still another object of the present invention to provide a driving system which is reliable.

In the present invention, automatic frequency tracking is accomplished by means of a phase lock loop. Furthermore, the output of the power amplifier stage is provided to the ultrasonic piezoelectric transducer via an output transformer which acts as both insulating transformer and a boosting transformer. This is done in order to provide the necessary protection against electrical shock which is required in cases where the transducer is used in medical instruments such as ultrasonic dental scalers and ultrasonic surgical scalpels, etc. Furthermore, a feedback transformer which acts as both an insulator transformer and a current transformer is connected in a series with the piezoelectric transducer and the secondary side of the output transformer. In this way, an output voltage is obtained which is proportional to the current flowing through the ultrasonic piezoelectric transducer. This output voltage is fed into a phase comparitor so that a phase lock loop (PLL) is formed.

Furthermore, in the power amplifier stage of the present invention, power amplification is accomplished by means of an inverter which uses a switching system. Accordingly, high efficiency is obtained. Furthermore, a power controller using a current limiting system is formed which does not allow a decrease in power but rather increases the power when the mechanical load on the piezoelectric transducer is increased. Furthermore, a resonance circuit whose Q-value is such that the circuit is actuated only in the vicinity of the resonance frequency of the piezoelectric transducer is formed in the secondary side of the feedback transformer in order to form a stable PLL by excluding the unnecessary frequency components of the current flowing through the piezoelectric transducer.

In addition, in the inverter using the switching system in the present driving system, cross-conduction involving excessive current caused by the upper and lower transistors both being switched on is prevented. Such cross-conduction is prevented since a transformer is used for the output side of the buffer stage which drives the inverter stage and a resonance circuit is formed on the primary side of the transformer. In this way the base current supplied to the upper and lower transistors of the inverter is thus formed into a roughly sinusoidal waveform so that cross-conduction is prevented.

BRIEF DESCRIPTION OF THE DRAWINGS

The above-mentioned features and objects of the present invention will become more apparent with reference to the following description taken in conjunction with the accompanying drawings wherein like reference numeral denote like elements and in which.

DETAILED DESCRIPTION OF THE INVENTION

Figure 1:
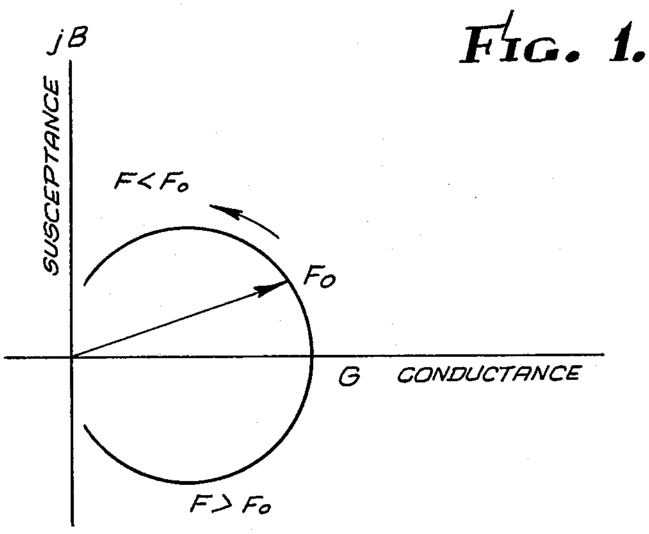
FIG. 1 illustrates the admittance characteristics of a piezoelectric transducer containing a resonance circuit.
Figure 2:
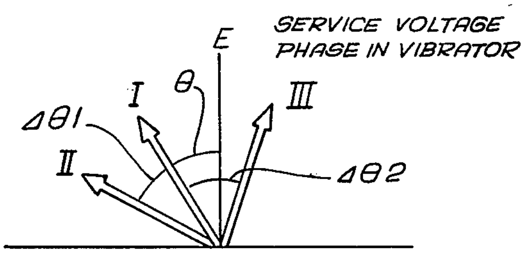
FIG. 2 is a vector diagram of the service voltage for the piezoelectric transducer.

The admittance characteristics of a piezoelectric transducer containing a resonance circuit are shown in FIG. 1. When the driving frequency (F) coincides with the resonance frequency ($F_o$) of the ultrasonic piezoelectric transducer, the phase difference between the phase of the current flowing through the ultrasonic piezoelectric transducer and the phase of the service voltage of piezoelectric transducer $\theta$ radians as shown by I in FIG. 2. When $F<F_o$ the phase of the current flowing through the ultrasonic piezoelectric transducer is further advanced $\Delta\theta$ radians as is shown in FIG. 2. Accordingly the current phase is advanced by a total of $\theta+\Delta\theta$ radians with respect to the voltage phase. Conversely, when $F<F_o$, the current phase is retarded by $\Delta\theta_2$ radians as is shown in FIG. 2 so that the phase difference between the current phase and the voltage phase is $(\theta-\Delta\theta_2)$ radians. In other words, the resonance frequency $F_o$ of the ultrasonic piezoelectric transducer varies, the phase difference between the phase of the service voltage of the ultrasonic piezoelectric transducer and the phase of the current flowing through the transducer shows a variation centered in the vicinity of the resonance frequency. In the present invention, when the driving frequency coincides with the resonance frequency of the transducer, the resonance frequecny and the admittance of the transducer vary in accordance with the load of the transducer and variations in the temperature of the transducer; however, realizing that a constant phase difference between the voltage and current within the transducer exists, a phase lock loop (PLL) is formed so that both phases are maintained in a constant relationship.

Figure 4:
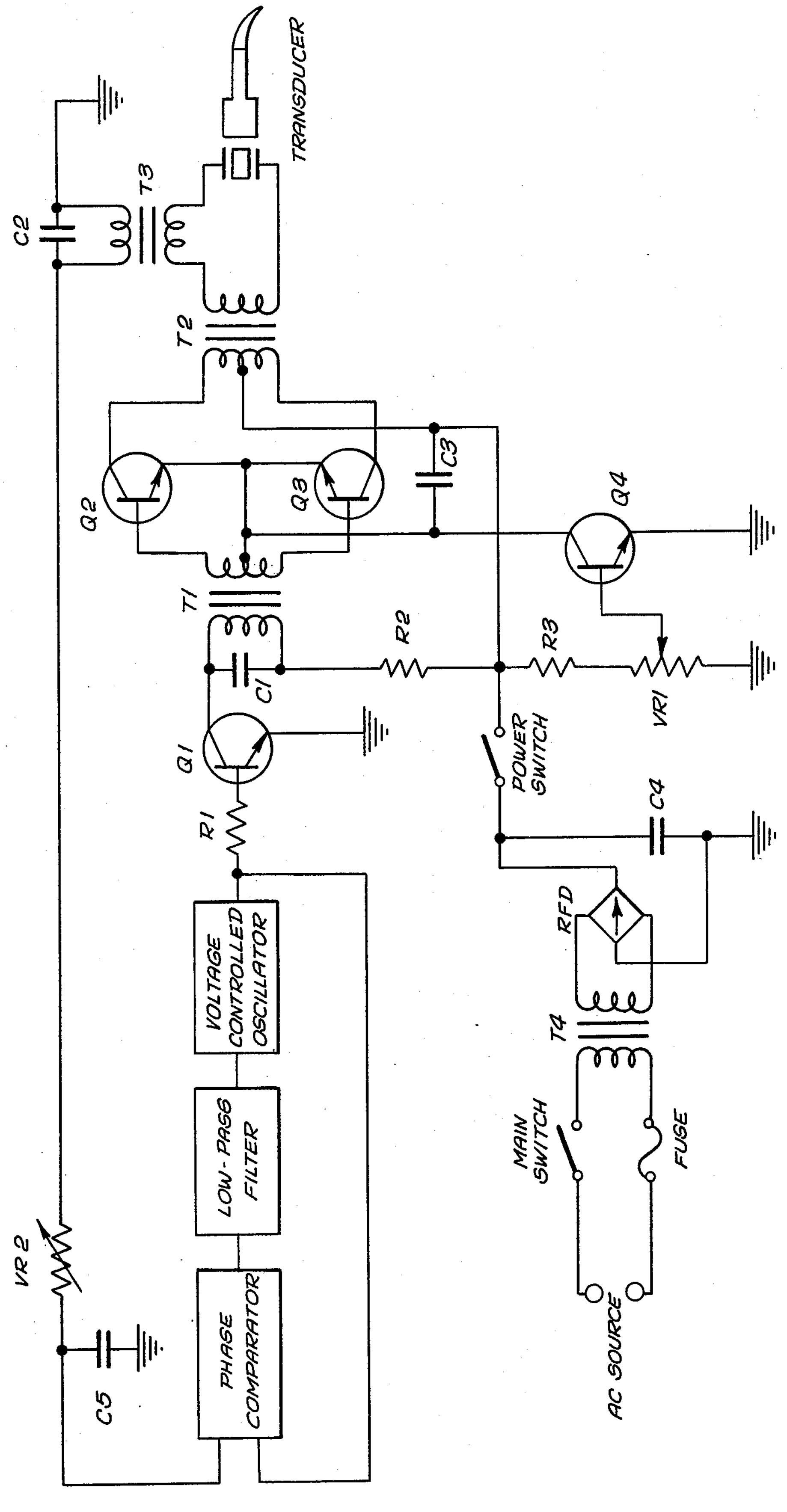
FIG. 4 is a diagram illustrating a driving system for a piezoelectric transducer in accordance with the teachings of the present invention.

Referring to FIG. 4, shown therein is a driving system in accordance with the teachings of the present invention. In the FIG. 4 the driving system includes a phase comparator 1, a low pass filter coupled to the output of the phase comparator 1 and a voltage controlled oscillator (VCO) having its control input coupled to the output of the low pass filter 2. For these three components, it would be possible to use an ordinary PLL IC in which all three devices are packaged together. The transistor Q1 constitutes a buffer stage which drives the power amplifier stage. This buffer stage is transformer coupled to the power amplifier stage. Resonance in the vicinity of the resonance frequency of the piezoelectric transducer is caused by the capacitor C1 which is installed on the primary side of the transformer T1. Accordingly, a roughly sinusoidal base current is supplied to the power amplifier stage. Transistors Q2 and Q3 form an inverter which acts as a power amplifier stage. The upper and lower transistors Q2 and Q3 perform an alternating switching action. Cross-conduction which would involve excessive current flow caused by the upper and lower transistors Q2 and Q3, both being switched on due to carrier storage is prevented as follows: The driving base current is given a roughly sinusoidal wave form by the buffer stage so that the rise time and fall time are smooth. As a result, cross-conduction is prevented.

The transformer T2 is an output transformer of the power amplifier stage and acts as both an insulating transformer and a boosting transformer. The inverter stage is operated at a safe low voltage and this voltage is boosted by the output transformer T2 to the voltage required for driving the piezoelectric transducer. As the same time, this output transformer insures safe operation by acting as an insulating transformer in which special consideration has been given to insulation between the primary and secondary side of the transformer T2.

A feedback transformer T3 which acts as both an insulating transformer and a current transformer (CT) is connecting in series with the secondary winding of transformer T2 and the piezoelectric transducer. An electrical signal which is proportional to the current flowing through the piezoelectric transducer is extracted and sent to an input of the phase comparator 1 wherein the phase difference between the signal from the feedback transformer 3 and a signal corresponding to the output voltage of VCO is detected. A capacitor C2 is connected in parallel with the secondary winding of the feedback transformer T3 so that a resonance condition is created in the vicinity of the resonance frequency of the piezoelectric transducer. Accordingly, the wave form of the phase feedback signal from the feedback transformer T3 is adjusted by blocking all components other than the resonance frequency which forms the basis of the current flowing through the transducer.

In the situation where operation of the ultrasonic tool requires that the object being worked be touched directly by the ultrasonic tool, the excessive mechanical vibration occurring at the instant of touching the object causes the ultrasonic piezoelectric transducer to go into an overpowered condition. The frequency component of this overpower condition include many of the components besides the resonance frequency. Accordingly, if this overpower condition is feedback "as is" into the phase comparator 1, there is a possibility that the feedback loop will be disturbed. Accordingly, safe operation becomes difficult. In the present invention, a capacitor C2 is connected in parallel (for a capacitor is connected in series) with the secondary winding of the feedback transformer T3 to form a type of band-pass filter which allows only frequency components in the vicinity of the resonance frequency of the transducer to pass. Accordingly, it is possible to form a stable PLL (phase lock loop). In this case, the same effect could be achieved by installing a resonance circuit on the primary side of the feedback transformer T3 instead of on the secondary side. Furthermore, in regard to the feedback transformer resonance circuit, it is necessary that the Q-value of the feedback transformer resonance circuit be lower than the Q-value of the ultrasonic piezoelectric transducer in order to establish a PLL system which can detect the phase difference between the voltage and current of the ultrasonic piezoelectric transducer and perform a phase feedback function.

The voltage generated on the secondary side of the feedback transformer is inputed into the phase comparator 1 via a phase shifter consisting of variable resistor VR2 and capacitor C5. This phase shifter is not restricted to the form described above and could comprise a fixed phase shifter or VR2 and C5 could be connected in a reversed configuration so that the phase advance could be adjusted. Depending on the signal-circuit phase circuit conduction characteristics, a phase shifter may be unnecessary. Furthermore, the location of the phase shifter is not restricted to the location shown in FIG. 4. The phase shifter can be installed anywhere in the phase lock loop as long as it is installed in a location where it can control the single-circuit conduction phase characteristics. In addition, the input transformer T1 causes a phase shift of approximately +90°, and the phase shifter consisting of VR2 and C5 is used for fine adjustment of the phase shift.

Figure 3:
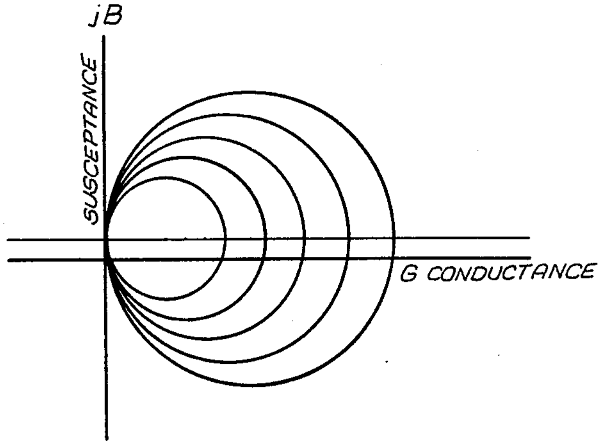
FIG. 3 illustrates the variation in the admittance characteristics of a piezoelectric transducer which changes in load.

Transistor Q4 works as a power controller. As is shown in FIG. 3, the admittance decreases as the mechanical load on the ultrasonic piezoelectric transducer increases. Accordingly, a current-limiting power controller is formed so that there is no load-caused drop in power, but rather an increase in power as shown in the following equation:

$$P=EI=I^2R_L\simeq I^2/Y$$

P: power, E: voltage, I: current, $R_L$: load connection, Y: admittance

Figure 5:
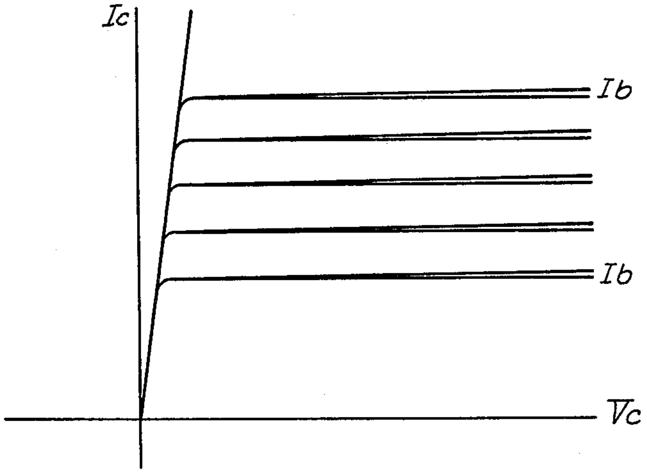
FIG. 5 illustrates the collector-emitter voltage versus collector-current characteristics of a transistor at certain base currents.

FIG. 5 shows the $V_c$ (collector-emitter voltage) and $I_c$ (collector current) characteristics of the transistor with various base currents ($I_b$). At a constant $I_b$, $I_c$ shows constant current characteristics when $V_c$ exceeds the saturation voltage. This fact is utilized to construct a very simple constant current circuit, so that $I_b$ can be varied by means of a varaiable resistor VR1. Accordingly, the current can be limited to any desired value and system can be used as a power controller. Furthermore, capacitor C3 in FIG. 4 is a ripple filter.

As is described above, the system provided by the present invention is an ultrasonic piezoelectric transducer driving system which has the following special features:

(i) ultrasonic piezolectric transducer with a high efficiency is driven via an output transformer which acts as both an insulating transformer and a boosting transformer;

(ii) a feedback transformer which acts as both an insulating transformer and a current transformer is used to extract a voltage which is proportional to the current flowing through the ultrasonic piezoelectric transducer and this voltage is used as an input to a phase comparitor of a phase lock loop circuit;

(iii) protective measures are taken against electrical shock for medical instruments;

(iv) a low-cost PLL IC is utilized;

(v) a resonance circuit with an appropriate Q-value is constructed from the winding of the feedback transformer and resonance capacitor with the result that stable automatic frequency tracking can be accomplished with a simple circuit layout; and (vi) a current limiting power controller is provided which causes the power to increase with an increase in load.

It should be apparent to those skilled in the art that the above described embodiment is merely one of many possible specific embodiments which represent applications to the principles of the present invention. Numerous and varied other arrangements can be readily devised by those skilled in the art without departing from the spirit and scope of the present invention.

I claim:

1. A driving circuit for ultrasonic tools which uses a piezoelectric transducer to convert ultrasonic electric signals into ultrasonic mechanical vibrations comprising:

a voltage-controlled oscillator which produces an output signal at a frequency that is proportional to an input voltage;

a power amplifier stage having its input coupled to the output of the voltage-controlled oscillator, said power amplifier stage comprising:

an output transformer which couples the output of the power amplifier stage to said piezoelectric transducer, said power output transformer further acting as both an insulating transformer and a boosting transformer for the power amplifier stage; and a feedback transformer coupled in series with a secondary side of said output transformer and said piezoelectric transducer, said feedback transformer having a secondary side through which a current flows which is proportional to the current flowing through said piezoelectric transducer;

a phase comparator which blocks high frequency difference between two signals applied to two inputs of said phase comparator, said two inputs being respectively coupled to output signal of said voltage controlling oscillator and said secondary side of said feedback transformer; and a low pass filter which blocks high frequency components of an input signal and allows only low frequency components to pass therethrough connected between an output of said phase comparator and said input of said voltage controlled oscillator.

2. A driving circuit according to claim 1 wherein a capacitor is connected in series with said secondary side of said feedback transformer and a resonance frequency of a circuit comprising said capacitor and said secondary side of said feedback transformer being in the vicinity of a resonance frequency of said piezoelectric trasducer.

3. A driving circuit according to claim 1 wherein a capacitor is connected in parallel with said secondary side of said feedback transformer and a resonance frequency of a circuit comprising said capacitor and said secondary side of said feedback transformer being in the vicinity of a resonance frequency of said piezoelectric transducer.

4. A driving circuit according to claim 1 wherein a capacitor is connected in series with a primary side of said feedback transformer and a resonance frequency of a circuit comprising said capacitor and said primary winding of said feedback transformer being in the vicinity of a resonance frequency of said piezoelectric transducer.

5. A driving circuit according to claim 1 wherein a cpacitor is connected in parallel with a primary winding of said feedback transformer and a resonance frequency of a circuit comprising said capacitor and said primary winding being in a vicinity of the resonance frequency of said piezoelectric transducer.

6. A driving circuit according to claim 1 wherein said power amplifier stage further comprises:

an inverter having upper and lower transistors which perform an alternate switching action, an output of said inverter being coupled to a primary side of said output transformer;

a buffer stage formed by a transistor for driving said inverter, an input of said buffer stage being coupled to an output of said voltage controlled oscillator;

a driving transformer for coupling said buffer stage to said inverter, said driving transformer having a primary winding coupled to a collector of said transistor of said buffer stage; and a capacitor connected in parallel with said primary winding of said driving transformer, said capacitor and said primary winding forming a circuit having a resonance frequency in the vicinity of the resonance of said piezoelectric transducer.

7. A driving circuit according to claim 6 wherein said power amplifier further comprises a power control circuit for variably controlling the current of said inverter.

8. A driving circuit according to claim 7 wherein said power control circuit comprises:

a power control transistor having a collector coupled to the emitters of said upper and lower transistors of said inverter and an emitter of said power control transistor coupled to the ground, said power control transistor further having a base coupled to a means for adjusting the base current.

9. A driving circuit according to claim 3 wherein said power amplifier stage comprises:

an inverter having upper and lower transistors which perform an alternate switching action, an output of said inverter being coupled to a primary side of said output transformer;

a buffer stage formed by a transistor for driving said inverter, an input of said buffer stage being coupled to an output of said voltage controlled oscillator;

a driving transformer for coupling said buffer stage to said inverter, said driving transistor having a primary winding coupled to collector of said transistor of said buffer stage; and a capacitor connected in parallel with said primary winding of said transformer, said capacitor and said primary winding forming a circuit having a resosance frequency in the vicinity of the resosance of said piezoelectric transducer.

10. A driving circuit according to claim 3 wherein said power amplifier stage further comprises a power control means for variably controlling the current of said inverter.

11. A driving circuit according to claim 3 wherein said power amplifier stage further comprises a power control circuit for variably controlling the current of said inverter and the power control circuit comprises:

a power control transistor having a collector coupled to the emitters of said upper and lower transistors of said inverter and an emitter of said power control transistor coupled to the ground, said power control transistor further having a base coupled to a means for adjusting the base current.

12. A driving circuit according to claim 4 wherein said power amplifier stage further comprises:

an inverter having upper and lower transistors which perform an alternate switching action, an output of said inverter being coupled to a primary side of said output transformer;

a buffer stage formed by a transistor for driving said inverter, an input of said buffer stage being coupled to an output of said voltage controlled oscillator;

a driving transformer for coupling said buffer stage to said inverter, said driving transformer having a primary winding coupled to collector of said transistor of said buffer stage; and a capacitor connected in parallel with said primary winding of said driving transformer, said capacitor and said primary winding forming a circuit having resonance frequency in the vicinity of the resonance of said piezoelectric transducer.

13. A driving circuit according to claim 4 wherein said power amplifier stage further comprises a power control circuit for variably controlling the current of said inverter.

* * * * *